United States Patent
Sheng (10) Patent No.: US 10,209,318 B2
(45) Date of Patent: Feb. 19, 2019

(54) ASYMMETRIC BATTERY TESTING APPARATUS

(71) Applicant: DHC Specialty Corp., Taipei (TW)

(72) Inventor: Hsien-Fang Sheng, Taipei (TW)

(73) Assignee: DHC Specialty Corp., Taipei (TW)

( * ) Notice: Subject to any disclaimer, the term of this patent is extended or adjusted under 35 U.S.C. 154(b) by 78 days.

(21) Appl. No.: 15/407,372

(22) Filed: Jan. 17, 2017

(65) Prior Publication Data

US 2018/0149707 A1     May 31, 2018

(30) Foreign Application Priority Data

Nov. 28, 2016   (TW) .............................. 105139082 A (51) Int. Cl.
*G01R 31/36*     (2006.01)

(52) U.S. Cl.
CPC ..... *G01R 31/3662* (2013.01); *G01R 31/3651* (2013.01); *G01R 31/3655* (2013.01); *G01R 31/3624* (2013.01)

(58) Field of Classification Search
CPC ............ G01R 31/3624; G01R 31/3655; G01R 31/3662
See application file for complete search history.

(56) References Cited

U.S. PATENT DOCUMENTS

| 6,424,157 | B1 * | 7/2002 | Gollomp | G01R 31/006 |
| | | | | 320/132 |
| 7,003,411 | B2 | 2/2006 | Bertness | |
| 8,958,998 | B2 | 2/2015 | Bertness | |
| 2002/0121901 | A1 * | 9/2002 | Hoffman | G01R 31/3662 |
| | | | | 324/426 |
| 2008/0094069 | A1 * | 4/2008 | Huang | G01R 31/3662 |
| | | | | 324/430 |

* cited by examiner

*Primary Examiner* — Jermele M Hollington
*Assistant Examiner* — Feba Pothen
(74) *Attorney, Agent, or Firm* — C. G. Mersereau; DeWitt LLP (57) ABSTRACT

An asymmetric battery testing apparatus tests a battery unit. The battery testing apparatus includes a first wire, a second wire, a third wire, and a testing circuit. The testing circuit includes a test-enabling unit and a control unit. Each wire has a resistance. The test-enabling unit includes a resistor to obtain a first resistor voltage value and a second resistor voltage value. The control unit obtains a battery internal resistance or a battery internal conductance which is a reciprocal of the battery internal resistance of the battery unit according to a battery internal voltage value, a wire voltage value, a first testing voltage value, a second testing voltage value, a testing resistance, the first resistor voltage value, the second resistor voltage value, and the resistances. Accordingly, shorter test time, lower contact failure, higher accuracy, lower power consumption, lower costs, and smaller size are implemented.

31 Claims, 8 Drawing Sheets

FIG. 6B
PRIOR ART

ASYMMETRIC BATTERY TESTING APPARATUS

CROSS-REFERENCE TO RELATED APPLICATIONS

This application claims the benefit of Taiwan patent application No. 105139082, filed on Nov. 28, 2016, the disclosure of which is incorporated herein in its entirety by reference.

BACKGROUND

1. Technical Field

The present disclosure relates generally to a battery testing apparatus, and more particularly to an asymmetric battery testing apparatus.

2. Description of Related Arts

Figure 5:
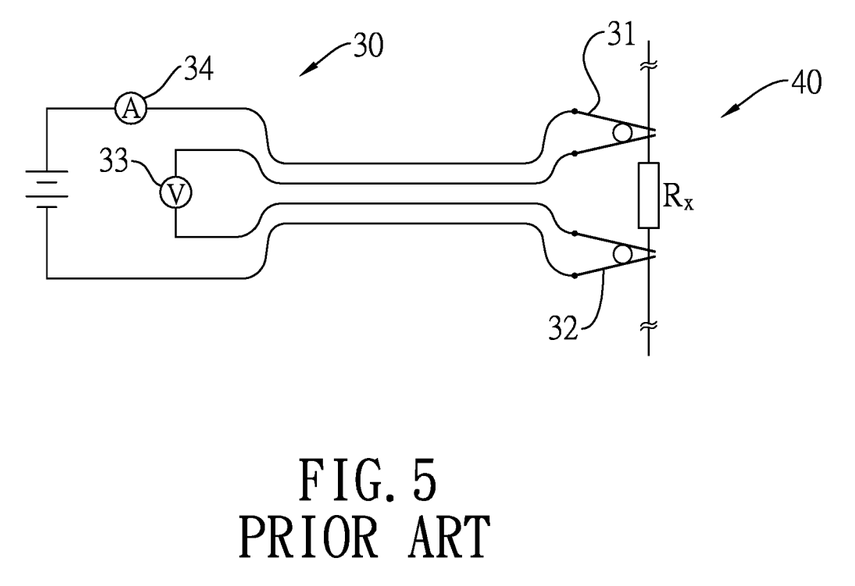
FIG. 5 is a schematic view of a connection between a conventional four-wire battery tester and a battery under test.

Referring to FIG. 5, a conventional four-wire connection is also referred to as Kelvin connection. A four-wire battery tester 30 provides two Kelvin clips, including a positive test clip 31 and a negative test clip 32 respectively clip a positive terminal and a negative terminal of a battery under test 40 for testing the battery under test 40. The four-wire battery tester 30 is provided to test a resistance under test Rx connected between the positive terminal and the negative terminal of the battery under test 40 so as to evaluate an aging degree and operating conditions of the battery unit 20. The resistance under test Rx represents an equivalent resistance between the positive terminal and the negative terminal of the battery under test 40. Also, a conductance under test Sx is inversely related to the resistance under test Rx, i.e., a reciprocal of the resistance under test Rx is the conductance under test Sx (Sx=1/Rx).

In the four-wire battery tester, a voltage meter 33 is used to measure a voltage difference between two ends of the resistance under test Rx, and a current meter 34 is used to measure a current flowing through the resistance under test Rx. Hence, the resistance under test Rx may be calculated according to the measured voltage difference and the measured current.

Since the conventional four-wire battery tester with a Kelvin connection has more number of electrical contacts, probability of contact failure and probability of inaccurate detection are increased. Also, costs of designing clipping process and used wires are higher.

U.S. Pat. No. 7,003,411 discloses an electronic battery tester for testing a storage battery. The electronic battery tester includes a test circuitry coupled to the storage battery to measure a dynamic parameter of the storage battery and responsively provide a battery test output related to a condition of the battery measured through Kelvin connections to the storage battery.

U.S. Pat. No. 8,958,998 discloses an electronic battery tester with a network communication. The electronic battery tester includes a test circuitry and a communication circuitry. The test circuitry has a Kelvin connection to couple the test circuitry to a specific battery under test. The communication circuitry transmits the battery test output formatted with the battery tester address on a communication link to a remote location.

Figure 6A:
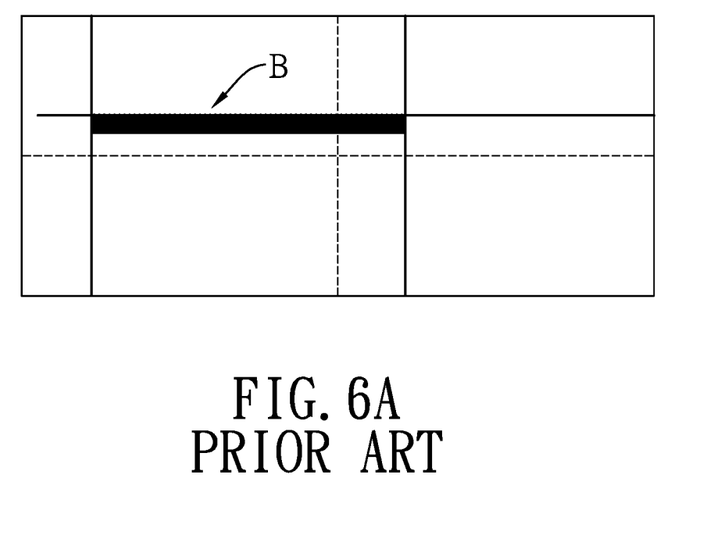
FIG. 6A is a schematic waveform provided by the conventional four-wire battery tester.
Figure 6B:
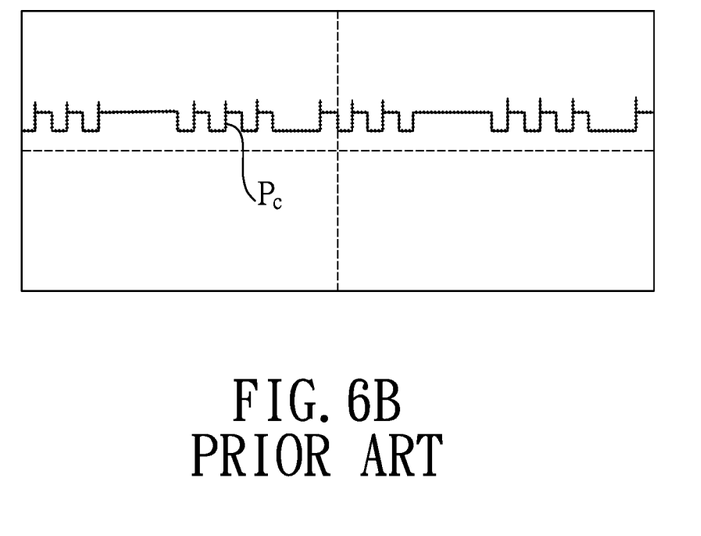
FIG. 6B is a partially enlarged view of FIG. 6A.

Referring to FIG. 6A and FIG. 6B, the conventional four-wire battery tester with a Kelvin connection commonly uses an active multi-stage test manner to test a battery under test by consecutively supplying current pluses Pc. For example, consecutive current pulses Pc are provided in 3.5 seconds and a period of each current pulse Pc is 35 milliseconds, including a 10-millisecond resting period and a 25-millisecond pulsing period. However, the response speed is slower, the test time is longer, and the operation power consumption is larger.

SUMMARY

An objective of the present disclosure is to provide an asymmetric battery testing apparatus to solve problems of increased probability of contact failure and probability of inaccurate detection and higher costs of designing clipping process and used wires since the four-wire battery tester has more number of electrical contacts, and solve problems of slower response speed, longer test time, and larger operation power consumption.

In order to achieve the above-mentioned objective, the asymmetric battery testing apparatus tests a battery internal resistance or a battery internal conductance which is a reciprocal of the battery internal resistance of a battery unit. The asymmetric battery testing apparatus includes a first wire, a second wire, a third wire, and a testing circuit. The first wire has a first resistance. The second wire has a second resistance. The third wire is connected to one of the first wire and the second wire and connected to one electrode terminal of the battery unit to obtain a wire voltage value. The testing circuit includes a test-enabling unit and a control unit. The test-enabling unit is connected to the first wire and the second wire and obtains a first testing voltage value and a second testing voltage value. The test-enabling unit includes a resistor having a testing resistance and the resistor provides a first resistor voltage value and a second resistor voltage value at two ends of the resistor, respectively. The control unit is connected to the test-enabling unit and receives the first testing voltage value, the second testing voltage value, the first resistor voltage value, and the second resistor voltage value. The control unit obtains the battery internal resistance or the battery internal conductance according to a battery internal voltage value of the battery unit, the wire voltage value, the first testing voltage value, the second testing voltage value, the testing resistance, the first resistor voltage value, the second resistor voltage value, the first resistance, and the second resistance when the control unit activates the test-enabling unit.

The asymmetric battery testing apparatus is provided to accurately calculate the battery internal resistance or the battery internal conductance according to the battery internal voltage value, the wire voltage value, the first testing voltage value, the second testing voltage value, the testing resistance, the first resistance, and the second resistance. In addition, the asymmetric battery testing apparatus provides a passive manner for testing the battery unit, thereby significantly increasing response speed, reducing test and operation time, and reducing operation power consumption. Furthermore, the three-wire asymmetric battery testing apparatus has less number of electrical contacts than the four-wire battery tester, thereby reducing probability of contact failure, probability of inaccurate detection, reducing costs of designing clipping process and used wires, and miniaturizing and lightening the asymmetric battery testing apparatus.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The features of the present disclosure believed to be novel are set forth with particularity in the appended claims. The present disclosure itself, however, may be best understood by reference to the following detailed description of the present disclosure, which describes an exemplary embodiment of the present disclosure, taken in conjunction with the accompanying drawings, in which:

DETAILED DESCRIPTION

Reference will now be made to the drawing figures to describe the present disclosure in detail.

Figure 1A:
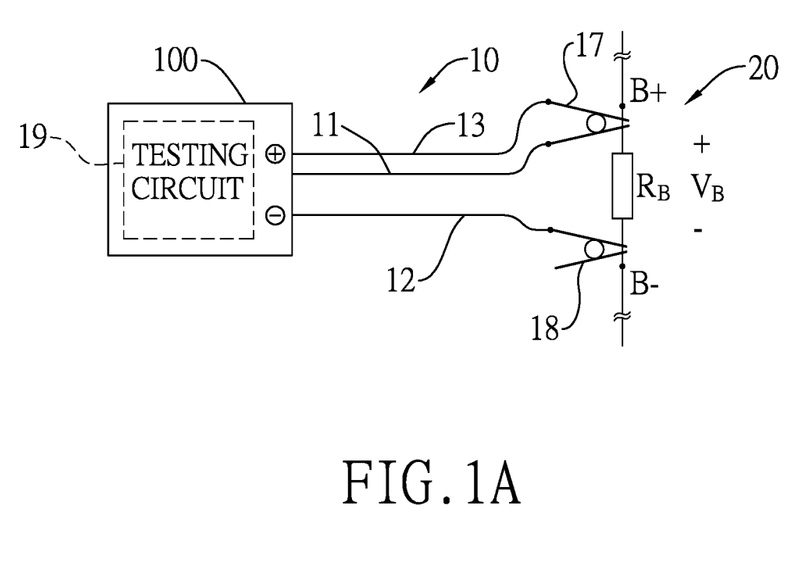
FIG. 1A is a schematic view of a connection between an asymmetric battery testing apparatus and a battery unit under test according to a first embodiment of the present disclosure.
Figure 1B:
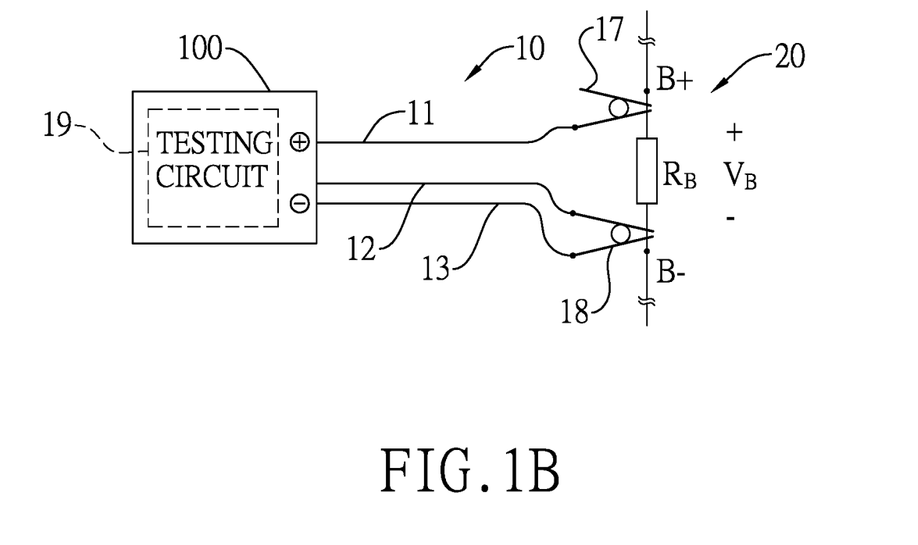
FIG. 1B is a schematic view of a connection between the asymmetric battery testing apparatus and the battery unit under test according to a second embodiment of the present disclosure.
Figure 2:
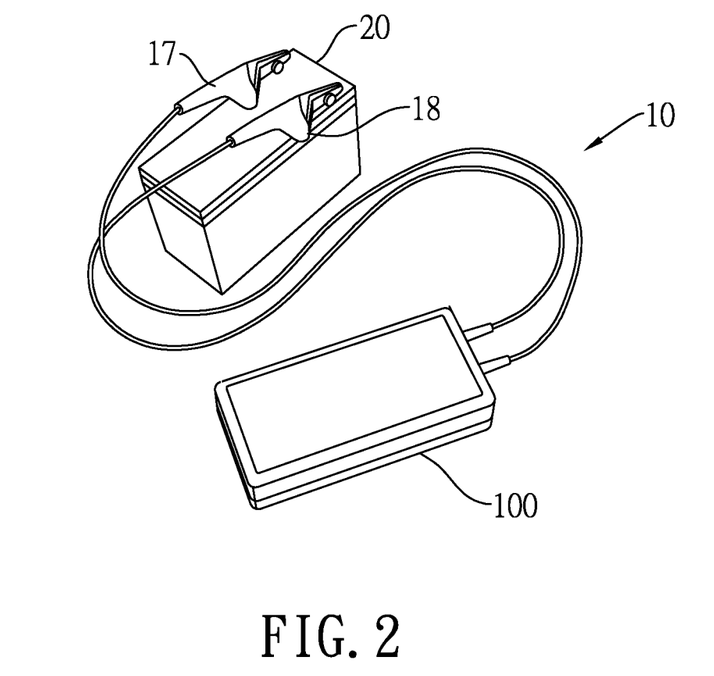
FIG. 2 is a schematic perspective view of a clipping connection between the asymmetric battery testing apparatus and the battery unit under test according to the present disclosure.

Referring to FIG. 1A, FIG. 1B, and FIG. 2, an asymmetric battery testing apparatus 10 is disclosed. A manner of testing a battery under test of the asymmetric battery testing apparatus 10 is different from that of the conventional symmetric four-wire battery tester. The conventional symmetric four-wire battery tester connects to a positive terminal and a negative terminal of the battery under test via two wires respectively. In contrast, the asymmetric battery testing apparatus 10 connects to the positive terminal and the negative terminal of the battery under test via different numbers of wires respectively.

Take a three-wire asymmetric battery testing apparatus for an example. The three-wire battery testing apparatus provides two wires to connect to a positive terminal of a battery under test and provides one wire to connect to a negative terminal of the battery under test. Alternatively, the three-wire battery testing apparatus provides two wires to connect to the negative terminal of the battery under test and provides one wire to connect to the positive terminal of the battery under test.

For convenience and clarity of explanation, the three-wire asymmetric battery testing apparatus is exemplified for further demonstration as follows. The asymmetric battery testing apparatus 10 includes a first wire 11, a second wire 12, a third wire 13, a first connection element 17, a second connection element 18, and a testing circuit 19. The first connection element 17 and the second connection element 18 may be connected to the battery unit 20 in a clipping manner such as an alligator clip for further demonstration. Also, the first connection element 17 and the second connection element 18 may be connected to the battery unit 20 in a gripping manner such as an o-ring. In the following embodiments, the alligator clip is exemplified for further demonstration.

The asymmetric battery testing apparatus 10 has a housing 100, and the testing circuit 19 is mounted inside the housing 100. As shown in FIG. 1A, the first connection element 17 is connected to the testing circuit 19 inside the housing 100 through the first wire 11 and the third wire 13, and the second connection element 18 is connected to the testing circuit 19 through the second wire 12 so that an asymmetric clip connection to the battery unit 20 is provided.

As shown in FIG. 1B, the first connection element 17 is connected to the testing circuit 19 through the first wire 11, and the second connection element 18 is connected to the testing circuit 19 through the second wire 12 and the third wire 13 so that an asymmetric clip connection to the battery unit 20 is provided.

In general, a battery internal resistance $R_B$ of the battery unit 20 is measured or detected to evaluate an aging degree of the battery unit 20. The battery internal resistance $R_B$ represents an equivalent resistance between a positive terminal B+ and a negative terminal B of the battery unit 20. Also, a battery internal conductance $S_B$ of the battery unit 20 is inversely related to the battery internal resistance $R_B$, i.e., a reciprocal of the battery internal resistance $R_B$ is the battery internal conductance $S_B$ ($S_B=1/R_B$).

The asymmetric battery testing apparatus 10 may transmit testing results to users' or operators' terminal devices in wireless or wired manners so that the users or the operators execute testing operations or monitor the testing results for the battery unit 20.

Figure 3A:
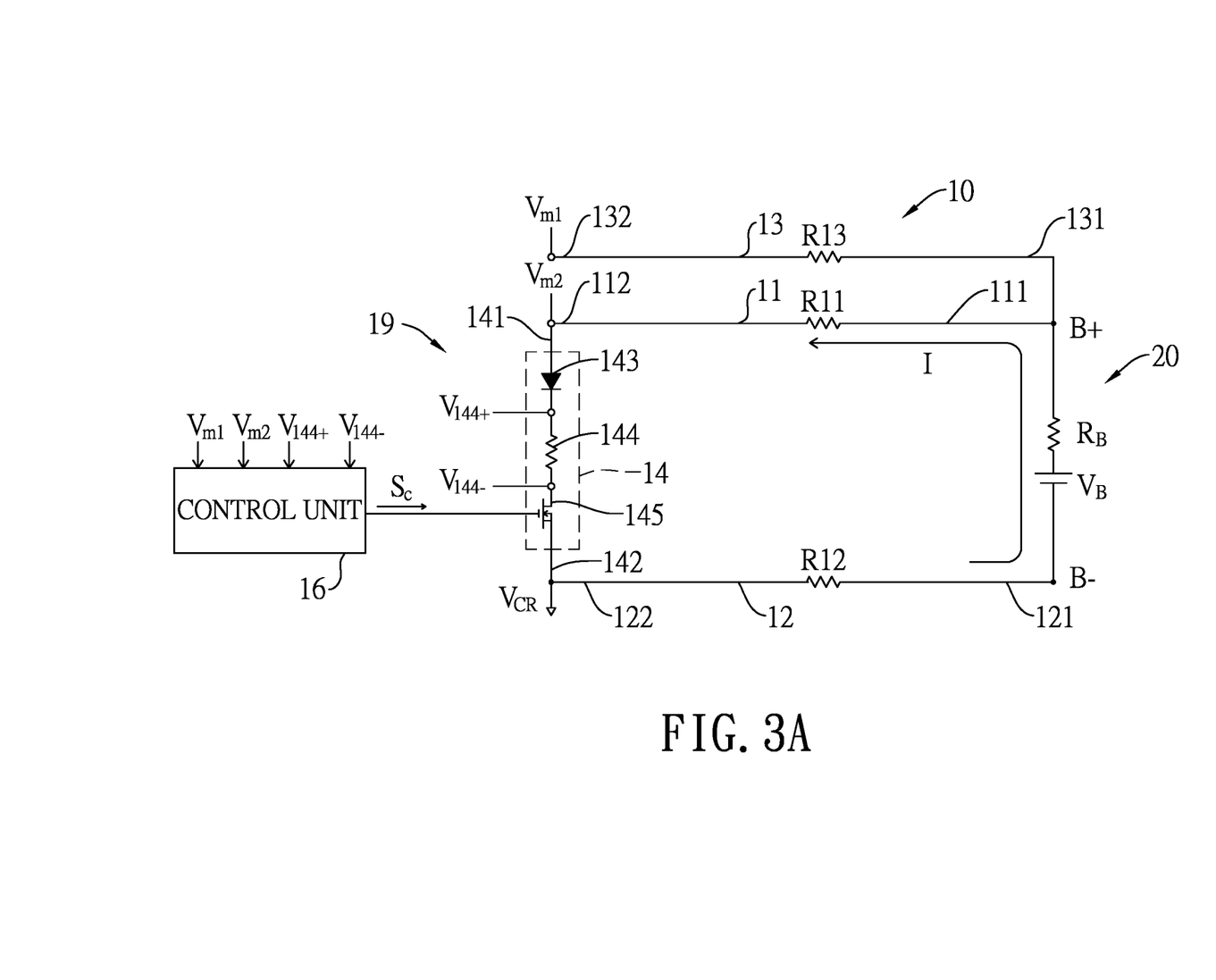
FIG. 3A is a circuit diagram of the asymmetric battery testing apparatus according to the first embodiment of the present disclosure.

Referring to FIG. 3A, the positive terminal B+ of the battery unit 20 is connected to the first wire 11 and the third wire 13 through the first connection element 17, and the negative terminal B_ of the battery unit 20 is connected to the second wire 12 through the second connection element 18. In other words, the first connection element 17 connected to the first wire 11 and the third wire 13 clips on the positive terminal B+ of the battery unit 20, and the second connection element 18 connected to the second wire 12 clips on the negative terminal B_ of the battery unit 20. The above-mentioned connection relationship is corresponding to FIG. 1A.

For simplicity and clarity, the battery unit 20 is represented by an equivalent battery internal voltage and an equivalent battery internal resistor connected to the equivalent battery internal voltage in series. The equivalent battery internal voltage provides a battery internal voltage value $V_B$ and the equivalent battery internal resistor provides the battery internal resistance $R_B$. The asymmetric battery testing apparatus 10 is used to test the battery internal resistance $R_B$ or the battery internal conductance $S_B$ of the battery unit 20. The asymmetric battery testing apparatus 10 includes the first wire 11, the second wire 12, the third wire 13, the first connection element 17, the second connection element 18, and the testing circuit 19. The testing circuit 19 includes a test-enabling unit 14 and a control unit 16.

The first wire 11 has a first end 111 and a second end 112, and a first resistance R11 exists between the first end 111 and the second end 112. The first resistance R11 is directly proportional to length and inversely proportional to cross-sectional area of the first wire 11, i.e., R11∝L1/A1, wherein L1 represents said length of the first wire 11 and A1 represents said cross-sectional area of the first wire 11. The first end 111 of the first wire 11 is electrically connected to the positive terminal B+ of the battery unit 20.

The second wire 12 has a first end 121 and a second end 122, and a second resistance R12 exists between the first end 121 and the second end 122. The second resistance R12 is directly proportional to length and inversely proportional to cross-sectional area of the second wire 12, i.e., R12∝L2/A2, wherein L2 represents said length of the second wire 12 and A2 represents said cross-sectional area of the second wire 12. The first end 121 of the second wire 12 is electrically connected to the negative terminal B_ of the battery unit 20.

The third wire 13 has a first end 131 and a second end 132, and a third resistance R13 exists between the first end 131 and the second end 132. In this embodiment, the third wire 13 is provided to obtain an open-circuit voltage value, i.e. a wire voltage value at the positive terminal B+ of the battery unit 20. The effect of the third resistance R13 may be neglected since the third resistance R13 of the third wire 13 is independent of the battery internal resistance $R_B$. The first end 131 of the third wire 13 is connected to the first end 111 of the first wire 11 and the positive terminal B+ of the battery unit 20. The second end 132 of the third wire 13 is connected to the testing circuit 19.

The test-enabling unit 14 has a first end 141 and a second end 142, a diode 143, a resistor 144, and a switch 145. The test-enabling unit 14 obtains a first testing voltage value at the first end 141 of the test-enabling unit 14 and a second testing voltage value at the second end 142 of the test-enabling unit 14. The diode 143 avoids the undesired reverse current. The resistor 144 having a test resistance R144 is provided to obtain a loop current. In the embodiment, the switch 145 may be, but not limited to, a MOSFET (metal-oxide-semiconductor field-effect transistor).

The switch 145 is connected to the diode 143 and the resistor 144 in series. The first end 141 of the test-enabling unit 14 is electrically connected to the second end 112 of the first wire 11. The second end 142 of the test-enabling unit 14 is electrically connected to the second end 122 of the second wire 12 and a common reference with a common reference voltage value $V_{CR}$. In this embodiment, the common reference voltage value $V_{CR}$ may be, but not limited to, a zero reference potential related to a positive voltage in the circuit, i.e., $V_{CR}$=0. As shown in FIG. 3A, the first end 141 of the test-enabling unit 14 is an anode of the diode 143 and the second end 142 of the test-enabling unit 14 is a source of an n-type MOSFET employed as the switch 145.

The control unit 16 is electrically connected to the test-enabling unit 14. The control unit 16 may be a microcontroller unit (MCU), a microprocessor (μP), or an application-specific integrated circuit (ASIC). As shown in FIG. 3A, the control unit 16 is electrically connected to a gate of the switch 145 of the test-enabling unit 14. The control unit 16 receives a first measure voltage value Vm1 measured at the second end 132 of the third wire 13, a second measure voltage value Vm2 measured at the second end 112 of the first wire 11, a first resistor voltage value $V_{144+}$ and a second resistor voltage value $V_{144-}$ measured at two ends of the resistor 144, respectively.

If the connection position of the resistor 144 and the diode 143 is interchanged, i.e., the resistor 144 is connected to the anode of the diode 143, and the first resistor voltage value $V_{144+}$ is equal to the second measure voltage value Vm2. The connection position of the resistor 144 and the diode 143 is not limited since it is easy to obtain voltage values at different positions by the test-enabling unit 14. The second measure voltage value Vm2, the first resistor voltage value $V_{144+}$, and the second resistor voltage value $V_{144-}$ are provided to the control unit 16. When the control unit 16 activates the switch 145 of the test-enabling unit 14, the control unit 16 obtains the battery internal resistance $R_B$ or the battery internal conductance $S_B$ according to the battery internal voltage value $V_B$, the second resistance R12, the testing resistance R144, the first measure voltage value Vm1, the first resistor voltage value $V_{144+}$ (or the second measure voltage value Vm2), and the second resistor voltage value $V_{144-}$.

In this embodiment, the first wire 11 and the third wire 13 are connected to the positive terminal B+ of the battery unit 20. The third wire 13 is provided to measure the first measure voltage value Vm1, i.e., the third wire 13 may be referred to as a voltage-measuring wire. The first wire 11 is provided to measure current flowing through a closed loop, i.e., the first wire 11 may be referred to as a current-measuring wire. In particular, the functions of the first wire 11 and the third wire 13 may be exchangeable. That is, the first wire 11 is provided as the voltage-measuring wire to measure the second measure voltage value Vm2, and the third wire 13 is provided as the current-measuring wire to measure current flowing through the closed loop.

Before the battery unit 20 is tested by the asymmetric battery testing apparatus 10, the test-enabling unit 14 is inactivated. That is, a current loop at the test-enabling unit 14 is open when the switch 145 is turned off by the control unit 16.

The battery unit 20 is tested by the asymmetric battery testing apparatus 10 when the test-enabling unit 14 is activated by the control unit 16. In other words, the control unit 16 produces a control signal Sc to the gate of the switch 145 to turn on the switch 145 when the battery unit 20 is tested so that the current loop at the test-enabling unit 14 is closed.

When the test-enabling unit 14 is activated, a loop current I is generated by the battery internal voltage of the battery unit 20 so that the loop current I flows through the first wire 11, the test-enabling unit 14, the second wire 12, and the battery unit 20. Hereinafter, operations of testing the battery unit 20 by the asymmetric battery testing apparatus 10 are described as follows.

The loop current I may be calculated as follows according to the resistor 144 of the test-enabling unit 14:

$$I=(V_{144+}-V_{144-})/R144 \qquad (1)$$

$V_{144+}$ represents a positive voltage value measured at one end of the resistor 144, $V_{144-}$ represents a negative voltage value measured at the other end of the resistor 144, and R144 represents the testing resistance.

In addition, a current and voltage relationship at the battery unit 20 is represented as follows:

$$Vm1-V_{CR}=V_B-(R_B+R12)\times I \qquad (2)$$

The formula (2) is further derived as follows:

$$R_B=(V_B+V_{CR}-Vm1)/I-R12 \qquad (3)$$

$R_B$ represents the battery internal resistance $R_B$, $V_B$ represents the battery internal voltage value, $V_{CR}$ represents the common reference voltage value, Vm1 represents the first measure voltage value, I represents the loop current, and R12 represents the second resistance.

After the formula (1) is incorporated into the formula (3), the battery internal resistance $R_B$ is represented as follows:

$$R_B=[(V_B+V_{CR}-Vm1)/(V_{144+}-V_{144-})]\times R144-R12 \quad (4)$$

The formula (4) may be calculated by the control unit 16. The battery internal voltage value $V_B$ is equal to an open-circuit voltage value between the positive terminal B+ and the negative terminal B_ of the battery unit 20 when the switch 145 is turned off, i.e. the loop current I is zero. The second resistance R12 may be obtained according to length, cross-sectional area, and resistivity of the second wire 12. If length, cross-sectional area, and resistivity of the second wire 12 are equal to those of the first wire 11, the second resistance R12 is equal to the first resistance R11. Hence, the second resistance R12 may be calculated, i.e. R12=R11=(Vm1−Vm2)/I. The testing resistance R144 may be designed to be known. The first measure voltage value Vm1, the first resistor voltage value $V_{144+}$ (or the second measure voltage value Vm2), and the second resistor voltage value $V_{144-}$ can be obtained by calculation. The common reference voltage value $V_{CR}$ is a zero reference potential, i.e. $V_{CR}=0$. Therefore, the formula (4) may be simplified as follows:

$$R_B=[(V_B-Vm1)/(V_{144+}-V_{144-})]\times R144-R12 \quad (5)$$

Further, if the second resistance R12 is k times great as the first resistance R11, wherein k is a real number, i.e., R12=k×R11, the formula (5) may be simplified as follows:

$$R_B=[(V_B-Vm1)/(V_{144+}-V_{144-})]\times R144-k\times R11 \quad (6)$$

Further, if the second wire 12 is made of a superconductor material or a metal copper material, the second wire 12 provides a micro resistance or even zero resistance, i.e. the second resistance R12 is regarded as zero. Therefore, the formula (5) may be simplified as follows:

$$R_B=[(V_B-Vm1)/(V_{144+}-V_{144-})]\times R144 \quad (6')$$

Based on the formula (6) or the formula (6'), the control unit 16 may accurately calculate the battery internal resistance $R_B$ to detect operating conditions and aging degree of the battery unit 20 according to the battery internal voltage value $V_B$, the test resistance R144 and/or the second resistance R12, the first measure voltage value Vm1, the first resistor voltage value $V_{144+}$ (or the second measure voltage value Vm2), and the second resistor voltage value $V_{144-}$.

Figure 3B:
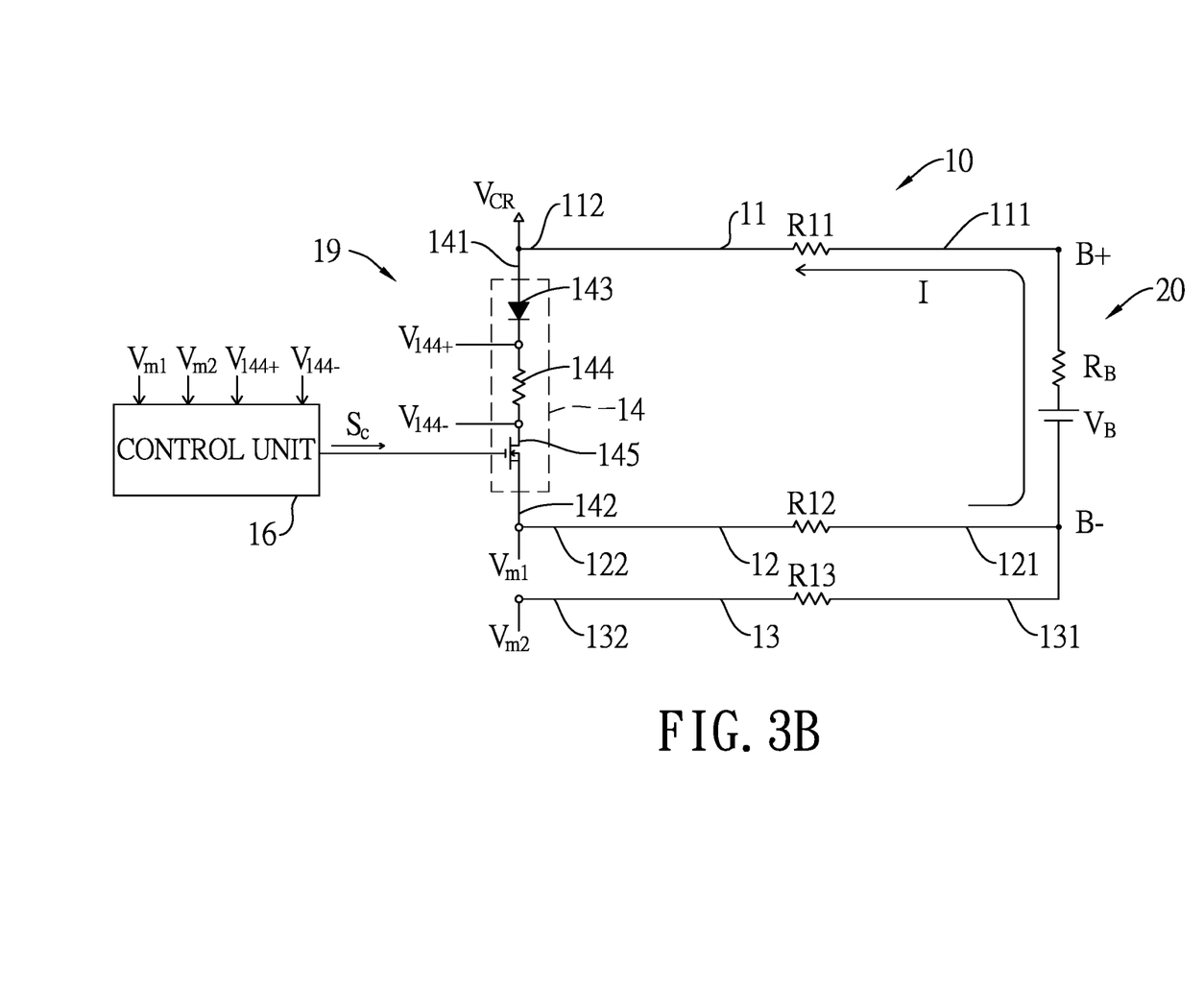
FIG. 3B is a circuit diagram of the asymmetric battery testing apparatus according to the second embodiment of the present disclosure.

Referring to FIG. 3B, the positive terminal B+ of the battery unit 20 is connected to the first wire 11 through the first connection element 17, and the negative terminal B_ of the battery unit 20 is connected to the second wire 12 and the third wire 13 through the second connection element 18. In other words, the first connection element 17 connected to the first wire 11 clips on the positive terminal B+ of the battery unit 20, and the second connection element 18 connected to the second wire 12 and the third wire 13 clips on the negative terminal B_ of the battery unit 20. The above-mentioned connection relationship is corresponding to FIG. 1B.

For simplicity and clarity, the battery unit 20 is represented by an equivalent battery internal voltage and an equivalent battery internal resistor connected to the equivalent battery internal voltage in series. The equivalent battery internal voltage provides a battery internal voltage value $V_B$ and the equivalent battery internal resistor provides a battery internal resistance $R_B$. The asymmetric battery testing apparatus 10 is used to test the battery internal resistance $R_B$ of the battery unit 20. The asymmetric battery testing apparatus 10 includes the first wire 11, the second wire 12, the third wire 13, the first connection element 17, the second connection element 18, and the testing circuit 19. The testing circuit 19 includes a test-enabling unit 14 and a control unit 16.

The first wire 11 has a first end 111 and a second end 112, and a first resistance R11 exists between the first end 111 and the second end 112. The first resistance R11 is directly proportional to length and inversely proportional to cross-sectional area of the first wire 11, i.e., R11∝L1/A1, wherein L1 represents said length of the first wire 11 and A1 represents said cross-sectional area of the first wire 11. The first end 111 of the first wire 11 is electrically connected to the positive terminal B+ of the battery unit 20.

The second wire 12 has a first end 121 and a second end 122, and a second resistance R12 exists between the first end 121 and the second end 122. The second resistance R12 is directly proportional to length and inversely proportional to cross-sectional area of the second wire 12, i.e., R12∝L2/A2, wherein L2 represents said length of the second wire 12 and A2 represents said cross-sectional area of the second wire 12. The first end 121 of the second wire 12 is electrically connected to the negative terminal B_ of the battery unit 20.

The third wire 13 has a first end 131 and a second end 132, and a third resistance R13 exists between the first end 131 and the second end 132. In this embodiment, the third wire 13 is provided to obtain an open-circuit voltage value, i.e. a wire voltage value at the negative terminal B_ of the battery unit 20. The effect of the third resistance R13 may be neglected since the third resistance R13 of the third wire 13 is independent of the battery internal resistance $R_B$. The first end 131 of the third wire 13 is connected to the first end 121 of the second wire 12 and the negative terminal B_ of the battery unit 20. The second end 132 of the third wire 13 is connected to the testing circuit 19.

The test-enabling unit 14 has a first end 141 and a second end 142, a diode 143, a resistor 144, and a switch 145. The test-enabling unit 14 obtains a first testing voltage value at the first end 141 of the test-enabling unit 14 and a second testing voltage value at the second end 142 of the test-enabling unit 14. The diode 143 avoids the undesired reverse current. The resistor 144 having a test resistance R144 is provided to obtain a loop current. In the embodiment, the switch 145 may be, but not limited to, a MOSFET (metal-oxide-semiconductor field-effect transistor).

The switch 145 is connected to the diode 143 and the resistor 144 in series. The first end 141 of the test-enabling unit 14 is electrically connected to the second end 112 of the first wire 11 and a common reference with a common reference voltage value $V_{CR}$. The second end 142 of the test-enabling unit 14 is electrically connected to the second end 122 of the second wire 12. In this embodiment, the common reference voltage value $V_{CR}$ may be, but not limited to, a zero reference potential related to a negative voltage in the circuit, i.e., $V_{CR}=0$. As shown in FIG. 3B, the first end 141 of the test-enabling unit 14 is an anode of the diode 143 and the second end 142 of the test-enabling unit 14 is a source of an n-type MOSFET employed as the switch 145.

The control unit 16 is electrically connected to the test-enabling unit 14. The control unit 16 may be a microcontroller unit (MCU), a microprocessor (µP), or an application-specific integrated circuit (ASIC). As shown in FIG. 3B, the control unit 16 is electrically connected to a gate of the switch 145 of the test-enabling unit 14. The control unit 16 receives a first measure voltage value Vm1 measured at the second end 122 of the second wire 12, a second measure voltage value Vm2 measured at the second end 132 of the third wire 13, a first resistor voltage value $V_{144+}$ and a second resistor voltage value $V_{144-}$ measured at two ends of the resistor 144, respectively.

If the connection position of the resistor 144 and the diode 143 is interchanged, i.e., the resistor 144 is connected to the anode of the diode 143, and the first resistor voltage value $V_{144+}$ is equal to the common reference voltage value $V_{CR}$. The connection position of the resistor 144 and the diode 143 is not limited since it is easy to obtain voltage values at different positions by the test-enabling unit 14. The common reference voltage value $V_{CR}$, the first resistor voltage value $V_{144+}$, and the second resistor voltage value $V_{144-}$ are provided to the control unit 16. When the control unit 16 activates the switch 145 of the test-enabling unit 14, the control unit 16 obtains the battery internal resistance $R_B$ according to the battery internal voltage value $V_B$, the first resistance R11, the testing resistance R144, the first measure voltage value Vm1, the first resistor voltage value $V_{144+}$ (or the common reference voltage value $V_{CR}$), and the second resistor voltage value $V_{144-}$.

In this embodiment, the second wire 12 and the third wire 13 are connected to the negative terminal B of the battery unit 20. The third wire 13 is provided to measure the second measure voltage value Vm2, i.e., the third wire 13 may be referred to as a voltage-measuring wire. The second wire 12 is provided to measure current flowing through a closed loop, i.e., the second wire 12 may be referred to as a current-measuring wire. In particular, the functions of the second wire 12 and the third wire 13 may be exchangeable. That is, the second wire 12 is provided as the voltage-measuring wire to measure the first measure voltage value Vm1, and the third wire 13 is provided as the current-measuring wire to measure current flowing through the closed loop.

Before the battery unit 20 is tested by the asymmetric battery testing apparatus 10, the test-enabling unit 14 is inactivated. That is, a current loop at the test-enabling unit 14 is open when the switch 145 is turned off by the control unit 16.

The battery unit 20 is tested by the asymmetric battery testing apparatus 10 when the test-enabling unit 14 is activated by the control unit 16. In other words, the control unit 16 produces a control signal Sc to the gate of the switch 145 to turn on the switch 145 when the battery unit 20 is tested so that the current loop at the test-enabling unit 14 is closed.

When the test-enabling unit 14 is activated, a loop current I is generated by the battery internal voltage of the battery unit 20 so that the loop current I flows through the first wire 11, the test-enabling unit 14, the second wire 12, and the battery unit 20. Hereinafter, operations of testing the battery unit 20 by the asymmetric battery testing apparatus 10 are described as follows.

The loop current I may be calculated as follows according to the resistor 144 of the test-enabling unit 14:

$$I = (V_{144+} - V_{144-})/R144 \quad (7)$$

$V_{144+}$ represents a positive voltage value measured at one end of the resistor 144, $V_{144-}$ represents a negative voltage value measured at the other end of the resistor 144, and R144 represents the testing resistance.

In addition, a current and voltage relationship at the battery unit 20 is represented as follows:

$$V_{CR} - Vm2 = V_B - (R_B + R11) \times I \quad (8)$$

The formula (8) is further derived as follows:

$$R_B = (V_B + Vm2 - V_{CR})/I - R11 \quad (9)$$

In which, $R_B$ represents the battery internal resistance, $V_B$ represents the battery internal voltage value, $V_{CR}$ represents the common reference voltage value, Vm2 represents the second measure voltage value, I represents the loop current, and R11 represents the first resistance.

After the formula (7) is incorporated into the formula (9), the battery internal resistance $R_B$ is represented as follows:

$$R_B = [(V_B + Vm2 - V_{CR})/(V_{144+} - V_{144-})] \times R144 - R11 \quad (10)$$

The formula (10) may be calculated by the control unit 16. The battery internal voltage value $V_B$ is equal to an open-circuit voltage value between the positive terminal B+ and the negative terminal B− of the battery unit 20 when the switch 145 is turned off, i.e. the loop current I is zero. The first resistance R11 may be obtained according to length, cross-sectional area, and resistivity of the first wire 11. If length, cross-sectional area, and resistivity of the first wire 11 are equal to those of the second wire 12, the first resistance R11 is equal to the second resistance R12. Hence, the first resistance R11 may be calculated, i.e. R11=R12= (Vm1−Vm2)/I. The testing resistance R144 may be designed to be known. The first measure voltage value Vm1, the first resistor voltage value $V_{144+}$ (or the common reference voltage value $V_{CR}$), and the second resistor voltage value $V_{144-}$ can be obtained by calculation. The common reference voltage value $V_{CR}$ is a zero reference potential, i.e. $V_{CR}=0$. Therefore, the formula (10) may be simplified as follows:

$$R_B = [(V_B + Vm2)/(V_{144+} - V_{144-})] \times R144 - R11 \quad (11)$$

Further, if the first resistance R11 is k times great as the second resistance R12, wherein k is a real number, i.e., R11=k×R12, the formula (11) may be simplified as follows:

$$R_B = [(V_B + Vm2)/(V_{144+} - V_{144-})] \times R144 - k \times R12 \quad (12)$$

Further, if the first wire 11 is made of a superconductor material or a metal copper material, the first wire 11 provides a micro resistance or even zero resistance, i.e. the first resistance R11 is regarded as zero. Therefore, the formula (11) may be simplified as follows:

$$R_B = [(V_B + Vm2)/(V_{144+} - V_{144-})] \times R144 \quad (12')$$

Based on the formula (12) or the formula (12'), the control unit 16 may accurately calculate the battery internal resistance $R_B$ to detect operating conditions and aging degree of the battery unit 20 according to the battery internal voltage value $V_B$, the test resistance R144 and/or the first resistance R11, the first measure voltage value Vm1, the first resistor voltage value $V_{144+}$ (or the common reference voltage value $V_{CR}$), and the second resistor voltage value $V_{144-}$.

The asymmetric battery testing apparatus 10 may transmit testing results to users' or operators' terminal devices in wireless or wired manners so that the users or the operators execute testing operations or monitor the testing results for the battery unit 20.

In the above-mentioned formulas, the symbol $R_B$ can be replaced by the reciprocal of the battery internal conductance $S_B$ ($R_B=1/S_B$). The detail description is omitted here for conciseness.

Figure 4A:
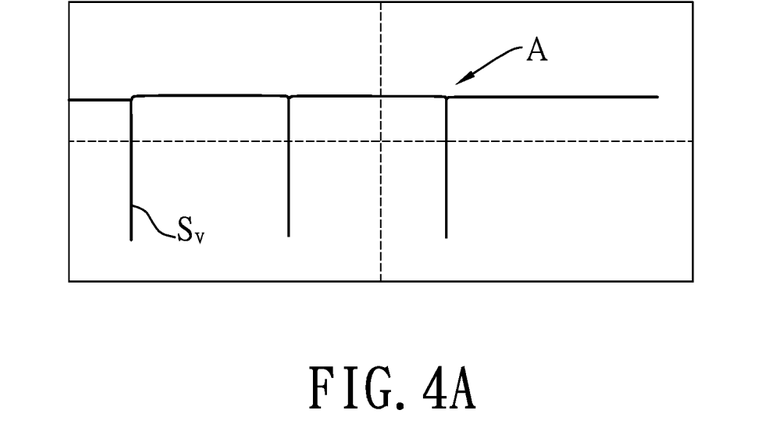
FIG. 4A is a schematic waveform provided by the asymmetric battery testing apparatus according to the present disclosure.
Figure 4B:
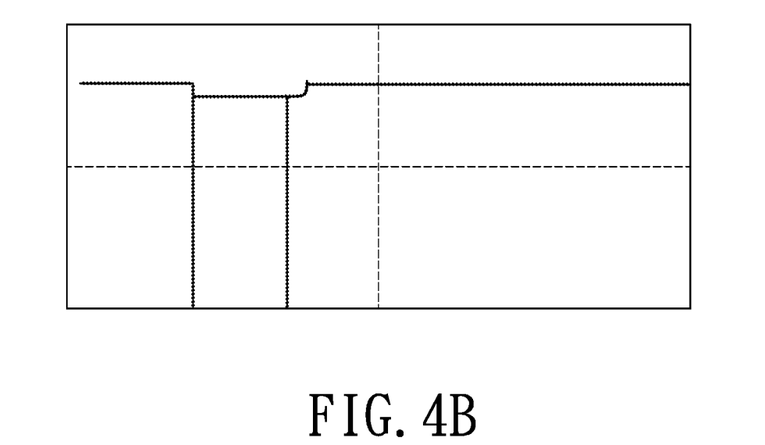
FIG. 4B is a partially enlarged view of FIG. 4A.

As shown in FIG. 4A and FIG. 4B, the asymmetric battery testing apparatus 10 tests the battery internal resistance $R_B$ of the battery unit 20 in a passive manner. The control unit 16 turns on the switch 145 of the test-enabling unit 14 and then tests the battery unit 20 by a discharging voltage Sv produced from the battery unit 20. The battery unit 20 is operated in three consecutive single-load discharges. Each period of the single-load discharge is 3.5 milliseconds, including a 1.5-millisecond discharging period and a 2-millisecond recovering period. Also, a time interval is 0.5 seconds. Accordingly, it is only necessary to complete testing the battery unit 20 in 1.5 seconds, thereby significantly increasing response speed and reducing test time.

In the present disclosure, the control unit 16 includes a microcontroller, a memory, an analog-to-digital converter, a digital-to-analog converter, an input unit, and an output unit. The memory is connected to the microcontroller to store data related to a battery testing. The memory may be, but not limited to, a ROM (read-only memory), a RAM (random access memory), a FLASH memory, or an EEPROM (electrically erasable programmable read-only memory). The analog-to-digital converter is connected to the microcontroller to convert analog data into digital data. The digital-to-analog converter is connected to the microcontroller to convert digital data into analog data. The input unit is connected to the microcontroller to input data related to the battery testing. The output unit is connected to the microcontroller to output data of testing results.

The control unit 16 is connected to an information input/output apparatus or an information control apparatus via different connection manners, such as a unidirectional or a bidirectional connection, a local or a remote connection, or a wired or a wireless connection to communicate with the information input/output apparatus or the information control apparatus. The information input/output apparatus may be, but not limited to, a smart phone, a tablet computer, a laptop computer, a desktop computer, a personal digital assistant (PDA), a keyboard, a printer, a physical server, or a cloud server. The information control apparatus may be, but not limited to, a smart phone, a tablet computer, a laptop computer, a desktop computer, a personal digital assistant (PDA), a printer, a physical server, or a cloud server.

The information contents processed by the information input/output apparatus or the information control apparatus include information of battery manufacturer, information of battery specification, information of testing result, information of testing date and time, information of testing location, information of installation location, or information of testing personnel. For example, the information contents may be a state of charge (SOC), a state of health (SOH), an open circuit voltage (OCV), an Ampere-hour (Ah), a Watt-hour (Wh), a reserve capacity (RC), a JIS battery type, a cranking ampere (CA), a marine cranking ampere (MCA), a SAE cold cranking ampere (CCA), an EN cold cranking ampere (CCA), a DIN cold cranking ampere (CCA), a battery brand, a vehicle brand, a vehicle identification number (VIN), and so on.

In conclusion, the present disclosure has the following advantages:

1. The battery internal resistance $R_B$ of the battery unit 20 may be accurately calculated by the control unit 16 according to the battery internal voltage value $V_B$, the test resistance R144 and/or the first resistance R H and the second resistance R12, the first measure voltage value Vm1, the second measure voltage value Vm2, the first resistor voltage value $V_{144+}$, and the second resistor voltage value $V_{144-}$.

2. The asymmetric battery testing apparatus 10 provides the passive manner for testing the battery unit 20, thereby significantly increasing response speed, reducing test and operation time, and reducing operation power consumption.

3. The three-wire asymmetric battery testing apparatus has less number of electrical contacts than the four-wire battery tester, thereby reducing probability of contact failure, probability of inaccurate detection, reducing costs of designing clipping process and used wires, and miniaturizing and lightening the asymmetric battery testing apparatus 10.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. An asymmetric battery testing apparatus configured to test a battery internal resistance or a battery internal conductance which is a reciprocal of the battery internal resistance of a battery unit, the asymmetric battery testing apparatus comprising:
    a first wire having:
        a first end connected to a positive terminal of the battery unit;
        a second end; and
        a first resistance existing between the first end and the second end of the first wire;
    a second wire having:
        a first end connected to a negative terminal of the battery unit;
        a second end; and
        a second resistance existing between the first end and the second end of the second wire;
    a third wire having:
        a first end connected to the first end of the first wire and the positive terminal or the negative terminal of the battery unit; and
        a second end obtaining a wire voltage value being an open-circuit voltage value at the positive terminal or at the negative terminal of the battery unit when a resistance of the third wire is negligible; and
    a testing circuit comprising:
        a test-enabling unit having:
            a first end connected to the second end of the first wire; and
            a second end connected to the second end of the second wire, wherein a common reference with a zero voltage is connected to the second end or the first end of the test-enabling unit when the wire voltage value is measured at the positive terminal or the negative terminal of the battery unit; and
        a resistor having a testing resistance and configured for providing a first resistor voltage value and a second resistor voltage value at two ends of the resistor, respectively; and
    a control unit connected to the test-enabling unit and configured to receive the wire voltage value, the first resistor voltage value, and the second resistor voltage value;
    wherein when the control unit is configured to activate the test-enabling unit, the control unit is configured to obtain the battery internal resistance or the battery internal conductance according to a battery internal voltage value of the battery unit, the wire voltage value, the testing resistance, the first resistor voltage value, the second resistor voltage value, and the second resistance when the wire voltage value is measured at the positive terminal of the battery unit, or according to the battery internal voltage value of the battery unit, the wire voltage value, the testing resistance, the first resistor voltage value, the second resistor voltage value, and the first resistance when the wire voltage value is measured at the negative terminal of the battery unit.

2. The asymmetric battery testing apparatus as claimed in claim 1, wherein the test-enabling unit further comprises:
a switch connected to the resistor in series to form a series-connected configuration, and the series-connected configuration of the test-enabling unit connected between the first wire and the second wire;
wherein the control unit is connected to the switch and provides a control signal to control the switch; the test-enabling unit is activated when the switch is turned on by the control signal.

3. The asymmetric battery testing apparatus as claimed in claim 1, wherein the test-enabling unit further comprises:
a diode; and
a switch connected to the diode and the resistor in series to form a series-connected configuration, and the series-connected configuration of the test-enabling unit connected between the first wire and the second wire;
wherein the control unit is connected to the switch and provides a control signal to control the switch; the test-enabling unit is activated when the switch is turned on by the control signal.

4. The asymmetric battery testing apparatus as claimed in claim 1, wherein the second wire is made of a superconductor material or a metal copper material.

5. The asymmetric battery testing apparatus as claimed in claim 2, wherein the second wire is made of a superconductor material or a metal copper material.

6. The asymmetric battery testing apparatus as claimed in claim 3, wherein the second wire is made of a superconductor material or a metal copper material.

7. The asymmetric battery testing apparatus as claimed in claim 1, wherein when the second testing voltage value is a zero reference potential,
the battery internal resistance is:

$$R_B=[(V_B-Vm1)/(V_{144+}-V_{144-})]\times R144-R12;$$

the battery internal conductance is:

$$S_B=1/\{[(V_B-Vm1)/(V_{144+}-V_{144-})]\times R144-R12\};$$

when R12 is k times great as R11, the battery internal resistance is:

$$R_B=[(V_B-Vm1)/(V_{144+}-V_{144-})]\times R144-k\times R11;$$

the battery internal conductance is:

$$S_B=1/\{[(V_B-Vm1)/(V_{144+}-V_{144-})]\times R144-k\times R11\};$$

when R12 is zero, the battery internal resistance is:

$$R_B=[(V_B-Vm1)/(V_{144+}-V_{144-})]\times R144;$$

the battery internal conductance is:

$$S_B=1/\{[(V_B-Vm1)/(V_{144+}-V_{144-})]\times R144\};$$

wherein
$R_B$ is the battery internal resistance;
$S_B$ is the battery internal conductance;
$V_B$ is the battery internal voltage value;
Vm1 is the wire voltage value;
$V_{144+}$ is the first resistor voltage value;
$V_{144-}$ is the second resistor voltage value;
R144 is the testing resistance;
R11 is the first resistance;
R12 is the second resistance; and
k is a real number.

8. The asymmetric battery testing apparatus as claimed in claim 2, wherein when the second testing voltage value is a zero reference potential,
the battery internal resistance is:

$$R_B=[(V_B-Vm1)/(V_{144+}-V_{144-})]\times R144-R12;$$

the battery internal conductance is:

$$S_B=1/\{[(V_B-Vm1)/(V_{144+}-V_{144-})]\times R144-R12\};$$

when R12 is k times great as R11, the battery internal resistance is:

$$R_B=[(V_B-Vm1)/(V_{144+}-V_{144-})]\times R144-k\times R11;$$

the battery internal conductance is:

$$S_B=1/\{[(V_B-Vm1)/(V_{144+}-V_{144-})]\times R144-k\times R11\};$$

when R12 is zero, the battery internal resistance is:

$$R_B=[(V_B-Vm1)/(V_{144+}-V_{144-})]\times R144;$$

the battery internal conductance is:

$$S_B=1/\{[(V_B-Vm1)/(V_{144+}-V_{144-})]\times R144\};$$

wherein
$R_B$ is the battery internal resistance;
$S_B$ is the battery internal conductance;
$V_B$ is the battery internal voltage value;
Vm1 is the wire voltage value;
$V_{144+}$ is the first resistor voltage value;
$V_{144-}$ is the second resistor voltage value;
R144 is the testing resistance;
R11 is the first resistance;
R12 is the second resistance; and
k is a real number.

9. The asymmetric battery testing apparatus as claimed in claim 3, wherein when the second testing voltage value is a zero reference potential,
the battery internal resistance is:

$$R_B=[(V_B-Vm1)/(V_{144+}-V_{144-})]\times R144-R12;$$

the battery internal conductance is:

$$S_B=1/\{[(V_B-Vm1)/(V_{144+}-V_{144-})]\times R144-R12\};$$

when R12 is k times great as R11, the battery internal resistance is:

$$R_B=[(V_B-Vm1)/(V_{144+}-V_{144-})]\times R144-k\times R11;$$

the battery internal conductance is:

$$S_B=1/\{[(V_B-Vm1)/(V_{141-})]\times R144-k\times R11\};$$

when R12 is zero, the battery internal resistance is:

$$R_B=[(V_B-Vm1)/(V_{144+}-V_{144-})]\times R144;$$

the battery internal conductance is:

$$S_B=1/\{[(V_B-Vm1)/(V_{144+}-V_{144-})]\times R144\};$$

wherein
$R_B$ is the battery internal resistance;
$S_B$ is the battery internal conductance;
$V_B$ is the battery internal voltage value;
Vm1 is the wire voltage value;
$V_{144+}$ is the first resistor voltage value;
$V_{144-}$ is the second resistor voltage value;
R144 is the testing resistance;
R11 is the first resistance;
R12 is the second resistance; and
k is a real number.

10. The asymmetric battery testing apparatus as claimed in claim 1, wherein the first wire is made of a superconductor material or a metal copper material.

11. The asymmetric battery testing apparatus as claimed in claim 2, wherein the first wire is made of a superconductor material or a metal copper material.

12. The asymmetric battery testing apparatus as claimed in claim 3, wherein the first wire is made of a superconductor material or a metal copper material.

13. The asymmetric battery testing apparatus as claimed in claim 1, wherein when the first testing voltage value is a zero reference potential,
the battery internal resistance is:

$$R_B=[(V_B+Vm2)/(V_{144+}-V_{144-})]\times R144-R11;$$

the battery internal conductance is:

$$S_B=1/\{[(V_B+Vm2)/(V_{144+}-V_{144-})]\times R144-R11\};$$

when R11 is k times great as R12, the battery internal resistance is:

$$R_B=[(V_B+Vm2)/(V_{144+}-V_{144-})]\times R144-k\times R12;$$

the battery internal conductance is:

$$S_B=1/\{[(V_B+Vm2)/(V_{144+}-V_{144-})]\times R144-k\times R12\};$$

when R11 is zero, the battery internal resistance is:

$$R_B=[(V_B+Vm2)/(V_{144+}-V_{144-})]\times R144;$$

the battery internal conductance is:

$$S_B=1/\{[(V_B+Vm2)/(V_{144+}-V_{144-})]\times R144\};$$

wherein $R_B$ is the battery internal resistance;
$S_B$ is the battery internal conductance;
$V_B$ is the battery internal voltage value;
Vm2 is the wire voltage value;
$V_{144+}$ is the first resistor voltage value;
$V_{144-}$ is the second resistor voltage value;
R144 is the testing resistance;
R11 is the first resistance;
R12 is the second resistance; and
k is a real number.

14. The asymmetric battery testing apparatus as claimed in claim 2, wherein when the first testing voltage value is a zero reference potential,
the battery internal resistance is:

$$R_B=[(V_B+Vm2)/(V_{144+}-V_{144-})]\times R144-R11;$$

the battery internal conductance is:

$$S_B=1/\{[(V_B+Vm2)/(V_{144+}-V_{144-})]\times R144-R11\};$$

when R11 is k times great as R12, the battery internal resistance is:

$$R_B=[(V_B+Vm2)/(V_{144+}-V_{144-})]\times R144-k\times R12;$$

the battery internal conductance is:

$$S_B=1/\{[(V_B+Vm2)/(V_{144+}-V_{144-})]\times R144-k\times R12\};$$

when R11 is zero, the battery internal resistance is:

$$R_B=[(V_B\pm Vm2)/(V_{144-}-V_{144-})]\times R144;$$

the battery internal conductance is:

$$S_B=1/\{[(V_B+Vm2)/(V_{144+}-V_{144-})]\times R144\};$$

wherein
$R_B$ is the battery internal resistance;
$S_B$ is the battery internal conductance;
$V_B$ is the battery internal voltage value;
Vm2 is the wire voltage value;
$V_{144+}$ is the first resistor voltage value;
$V_{144-}$ is the second resistor voltage value;
R144 is the testing resistance;
R11 is the first resistance;
R12 is the second resistance; and
k is a real number.

15. The asymmetric battery testing apparatus as claimed in claim 3, wherein when the first testing voltage value is a zero reference potential,
the battery internal resistance is:

$$R_B=[(V_B+Vm2)/(V_{144+}-V_{144-})]\times R144-R11;$$

the battery internal conductance is:

$$S_B=1/\{[(V_B\pm Vm2)/(V_{144+}-V_{144-})]\times R144-R11\};$$

when R11 is k times great as R12, the battery internal resistance is:

$$R_B=[(V_B+Vm2)/(V_{144+}-V_{144-})-]\times R144-k\times R12;$$

the battery internal conductance is:

$$S_B=1/\{[(V_B+Vm2)/(V_{144+}-V_{144-})]\times R144-k\times R12\};$$

when R11 is zero, the battery internal resistance is:

$$R_B=[(V_B+Vm2)/(V_{144+}-V_{144-})]\times R144;$$

the battery internal conductance is:

$$S_B=1/\{[(V_B+Vm2)/(V_{144+}-V_{144-})]\times R144\};$$

wherein
$R_B$ is the battery internal resistance;
$S_B$ is the battery internal conductance;
$V_B$ is the battery internal voltage value;
Vm2 is the wire voltage value;
$V_{144+}$ is the first resistor voltage value;
$V_{144-}$ is the second resistor voltage value;
R144 is the testing resistance;
R11 is the first resistance;
R12 is the second resistance; and
k is a real number.

16. The asymmetric battery testing apparatus as claimed in claim 1, further comprising:
a first connection element connected to the first wire and configured to provide an electrical connection with one electrode terminal of the battery unit; and
a second connection element connected to the second wire and configured to provide an electrical connection with the other electrode terminal of the battery unit;
wherein the first connection element or the second connection element is connected to the third wire.

17. The asymmetric battery testing apparatus as claimed in claim 1, wherein the control unit comprises:
a microcontroller;
a memory connected to the microcontroller to store data related to a battery testing;
an analog-to-digital converter connected to the microcontroller to convert analog data into digital data;
a digital-to-analog converter connected to the microcontroller to convert digital data into analog data;
an input unit connected to the microcontroller to input data related to the battery testing; and
an output unit connected to the microcontroller to output data of testing results.

18. The asymmetric battery testing apparatus as claimed in claim 2, wherein the control unit comprises:
a microcontroller;
a memory connected to the microcontroller to store data related to a battery testing;
an analog-to-digital converter connected to the microcontroller to convert analog data into digital data;
a digital-to-analog converter connected to the microcontroller to convert digital data into analog data;

an input unit connected to the microcontroller to input data related to the battery testing; and an output unit connected to the microcontroller to output data of testing results.

19. The asymmetric battery testing apparatus as claimed in claim 3, wherein the control unit comprises:

a microcontroller;

a memory connected to the microcontroller to store data related to a battery testing;

an analog-to-digital converter connected to the microcontroller to convert analog data into digital data;

a digital-to-analog converter connected to the microcontroller to convert digital data into analog data;

an input unit connected to the microcontroller to input data related to the battery testing; and an output unit connected to the microcontroller to output data of testing results.

20. The asymmetric battery testing apparatus as claimed in claim 17, wherein the control unit is connected to an information input/output apparatus or an information control apparatus; wherein connection manners between the control unit and the information input/output apparatus or the information control apparatus are: a unidirectional or a bidirectional connection, a local or a remote connection, or a wired or a wireless connection.

21. The asymmetric battery testing apparatus as claimed in claim 18, wherein the control unit is connected to an information input/output apparatus or an information control apparatus; wherein connection manners between the control unit and the information input/output apparatus or the information control apparatus are: a unidirectional or a bidirectional connection, a local or a remote connection, or a wired or a wireless connection.

22. The asymmetric battery testing apparatus as claimed in claim 19, wherein the control unit is connected to an information input/output apparatus or an information control apparatus; wherein connection manners between the control unit and the information input/output apparatus or the information control apparatus are: a unidirectional or a bidirectional connection, a local or a remote connection, or a wired or a wireless connection.

23. The asymmetric battery testing apparatus as claimed in claim 20, wherein the information input/output apparatus is a smart phone, a tablet computer, a laptop computer, a desktop computer, a personal digital assistant (PDA), a keyboard, a printer, a physical server, or a cloud server.

24. The asymmetric battery testing apparatus as claimed in claim 21, wherein the information input/output apparatus is a smart phone, a tablet computer, a laptop computer, a desktop computer, a personal digital assistant (PDA), a keyboard, a printer, a physical server, or a cloud server.

25. The asymmetric battery testing apparatus as claimed in claim 22, wherein the information input/output apparatus is a smart phone, a tablet computer, a laptop computer, a desktop computer, a personal digital assistant (PDA), a keyboard, a printer, a physical server, or a cloud server.

26. The asymmetric battery testing apparatus as claimed in claim 20, wherein the information control apparatus is a smart phone, a tablet computer, a laptop computer, a desktop computer, a personal digital assistant (PDA), a keyboard, a physical server, or a cloud server.

27. The asymmetric battery testing apparatus as claimed in claim 21, wherein the information control apparatus is a smart phone, a tablet computer, a laptop computer, a desktop computer, a personal digital assistant (PDA), a keyboard, a physical server, or a cloud server.

28. The asymmetric battery testing apparatus as claimed in claim 22, wherein the information control apparatus is a smart phone, a tablet computer, a laptop computer, a desktop computer, a personal digital assistant (PDA), a keyboard, a physical server, or a cloud server.

29. The asymmetric battery testing apparatus as claimed in claim 20, wherein information contents processed by the information input/output apparatus or the information control apparatus include information of battery manufacturer, information of battery specification, information of testing result, information of testing date and time, information of testing location, information of installation location, or information of testing personnel.

30. The asymmetric battery testing apparatus as claimed in claim 21, wherein information contents processed by the information input/output apparatus or the information control apparatus include information of battery manufacturer, information of battery specification, information of testing result, information of testing date and time, information of testing location, information of installation location, or information of testing personnel.

31. The asymmetric battery testing apparatus as claimed in claim 22, wherein information contents processed by the information input/output apparatus or the information control apparatus include information of battery manufacturer, information of battery specification, information of testing result, information of testing date and time, information of testing location, information of installation location, or information of testing personnel.

* * * * *